United States Patent
Tursky et al.

Patent Number: 5,294,843
Date of Patent: Mar. 15, 1994

[54] FREEWHEELING DIODE CIRCUIT

[75] Inventors: Werner Tursky, Schwabach; Josef Lutz, Nürnberg, both of Fed. Rep. of Germany

[73] Assignee: Semikron Elektronik GmbH, Nürnberg, Fed. Rep. of Germany

[21] Appl. No.: 966,696

[22] Filed: Oct. 26, 1992

[30] Foreign Application Priority Data

Oct. 25, 1991 [DE] Fed. Rep. of Germany ........ 4135259

[51] Int. Cl.⁵ .............................................. H03K 19/12
[52] U.S. Cl. .................................. 307/317.1; 307/259; 257/611; 257/656
[58] Field of Search ........................ 307/256, 317.1; 257/610, 611, 612, 608, 656

[56] References Cited

U.S. PATENT DOCUMENTS

| | | | |
|---|---|---|---|
| 3,553,536 | 11/1968 | Neilson | 257/610 |
| 3,982,974 | 9/1976 | Edel et al. | 257/611 |
| 4,476,481 | 10/1984 | Iesaka et al. | 257/610 |
| 4,594,602 | 6/1986 | Iimura et al. | 257/610 |
| 5,181,083 | 1/1993 | Pezzani | 257/656 |

FOREIGN PATENT DOCUMENTS

| | | |
|---|---|---|
| 0103138 | 11/1987 | European Pat. Off. . |
| 0450306 | 10/1991 | European Pat. Off. . |
| 3632716 | 3/1988 | Fed. Rep. of Germany . |
| 3331631 | 8/1990 | Fed. Rep. of Germany . |

OTHER PUBLICATIONS

IBM Technical Disclosure Bulletin "Bipolar FET High-Speed Logic Switch" vol. 14, No. 12, May 1972.

*Primary Examiner*—William L. Sikes
*Assistant Examiner*—My Trang Ton
*Attorney, Agent, or Firm*—Horst M. Kasper

[57] ABSTRACT

A freewheeling diode device (10) for a commutation branch includes a first diode (12) with a soft recovery behavior and a second diode (14) with a snappy recovery behavior. The second diode (14) is connected in parallel to the first diode (12).

24 Claims, 10 Drawing Sheets

FREEWHEELING DIODE CIRCUIT

BACKGROUND OF THE INVENTION

1. Field of the Invention

The invention relates to a freewheeling diode device for a switchable device component including a commutator branch.

2. Brief Description of the Background of the Invention Including Prior Art

A so-called freewheeling diode is used in switching circuits with inductive load such as described, for example, in the German Printed Patent document P-4,105,155.6 of the applicants. The requirements relative to the respective freewheeling diodes increase with the quality of switching device components. In addition to a blocking voltage loadability of, for example, more than 1200 volts, to a low forward voltage drop and to a small reverse current, there is required a soft recovery behavior, i.e. a soft reverse current behavior, wherein reference is made to a property related to the dynamic behavior of the diode, as described in the German Printed Patent document DE-3,823,795-A1. This soft reverse current behavior of the diode concerns the emptying of a plasma of charge carriers from the semiconductor body during switching from the conducting phase into the blocking phase In case of a soft recovery behavior, the reverse current decays slowly. Since the induced surge voltage corresponds to this decay behavior, only a small voltage is generated in case of a soft switching diode, whereas in contrast high voltages can be induced in connection with a diode with a hard or snappy switching behavior. The characterizing parameter for the recited recovery behavior is the so-called softness factor, as is defined in the above-recited reference, German Printed Patent document DE-3,823,795-A1.

A freewheeling diode is essentially a rectifier diode connected across an inductive load to carry a current resulting from the energy stored in the inductance when no power is being supplied by the source to the load and until all the energy in the inductance has been dissipated or until the next voltage In connection with devices of fast-recovery power diodes of conventional construction, the recovery behavior is influenced by doping and dimension of the high-resistive center zone of the three-layer structure of the semiconductor body.

A fast-recovery diode is essentially a diode in which very little carrier storage occurs and which may therefore be used to give an ultrahigh speed of operation.

Depending on the presetting of the reverse blocking voltage loadability, the maximum doping concentration can amount to, for example, $1 \times 10^{14}$ cm$^3$ for 1000 volts and to $7 \times 10^{13}$ cm$^3$ for 2000 volts with a coordinated minimum thickness of the center zone of 80 microns or, respectively, 180 microns. To make a soft recovery diode there exists a general rule that the n$^-$ layer is to be produced in such doping and in such thickness, that the charge carrier zone does not reach the n$^+$ zone in case of a presence of maximum allowable operating voltages.

However, the recovery behavior cannot be optimized in a desired way, based solely on the dimensioning of the width of the center zone by way of a predetermination of doping concentration and blocking capability, as has been shown by investigations. The requirements to the softness factor w, depending on the application case and depending on the application of the presently offered switchable semiconductor device elements, are not achievable with such dimensioning of a fast-recovery power diode.

It is further known to employ an irradiation with protons and an irradiation with helium nuclei for setting the local carrier lifetimes and thus for influencing the switching behavior in the sense of a changing of the recovery behavior. This advantage of this method is the substantial apparatus expenditure and effort required in processing times.

A further constructive possibility includes a subdivision of a p anode zone into two zones, of which the inner zone exhibits a surface concentration of from $1 \times 10^{15}$ to $2 \times 10^{16}$ cm$^3$ and where the outer zone, having a doping level concentration larger than $3 \times 10^{17}$ and a penetration depth less than 2 micrometers, serves only for ohmic contacting. Such structure is taught, for example, in German Patent Application Laid Open DE-OS 3,633,161. This structure furnishes an improved recovery behavior based on a substantial lowering of the charge carrier concentration on the p side. The structure taught in German Patent Application Laid Open DE-OS 3,633,161, however, is associated with a substantially reduced surge current in addition to higher production costs and expenditures.

In addition, it is possible to subdivide this p zone into several sub-regions, of which one exhibits a higher penetration depth, as well as to import n$^+$ doped islands into the p zone. Again, the disadvantage associated with such structure resides in an increased production expenditure based on a requirement of masked diffusion.

In connection with known construction shapes of fast power diodes, the recovery behavior is influenced, for example, by doping of the emitter, by special emitter structures, or by proton irradiation. It has been found, however, that these steps for the improvement of the soft recovery behavior are obtained at the expense of the forward voltage drop. This causes high on stage losses and high switching losses. In particular, the switching losses on one of the limit for the use of the known freewheeling diodes with soft recovery behavior.

The dynamic loadability of freewheeling diodes has been considered in lecture notes for the 20th Colloquium Semiconductor Power Device Elements and Material Quality of Silicon in a lecture entitled "Dynamic Loadability of Freewheeling Diodes" by U. Scheuermann, J. Lutz, R. Spiegl of the Semikron company in Nuremberg, Germany. This paper shows how the dynamic behavior of various freewheeling diodes can be determined and that certain problems arise in the dynamic behavior when freewheeling diodes are commutated.

The journal article by S. D. Brotherton et al., entitled "A Comparison of the Performance of Gold and Platinum Killed Power Diodes" published in Solid-State Electronics, Vol. 25, No. 2, pages 119-125 (1982) shows the influence of the distribution of deep impurities such as gold upon the detailed switching characteristics.

The journal article by Yu. V. Bulgakov et al., in the publication Soviet Physics Semiconductors, Vol. 18, Issue 9, September 1984, pages 1009-1010 brings an article entitled "Investigation of the Profile of Recombination Parameters of Proton-irradiated Silicon". The article describes a method for determining the profile of the diffusion length of minority carriers in silicon.

The journal article by E. E. Velmre, in the Soviet publication Electrical Engineering, Vol. 55, No. 3, pages 47-51 (1984), entitled "Influence of the Lifetime Distribution of Electrons and Holes on the Reverse Recovery Process of p+—n—n+ Diodes" shows the results of a study of the reverse recovery process of diffused diodes.

The German Printed Patent Document DE-3,631,136-A1 to Peter Voss teaches a diode with a soft recovery behavior. The reference teaches the production of such a diode.

The German Patent DE-2,506,102-C3 to Hansjochen Benda et al., teaches a semiconductor rectifier. The reference is concerned to provide a structure which dampens high-frequency oscillations in a semiconductor rectifier.

The German Patent DE-3,008,034-C2 to Yoshihito Amemiya et al. teaches an electrode for semiconductor device elements. The teaching of the reference is directed to reducing the voltage drop in forward direction and the recovery time of a diode.

SUMMARY OF THE INVENTION

1. Purposes of the Invention

It is an object of the present invention to improve a freewheeling diode device of the kind recited, where the switching losses are to be reduced during commutation in a commutating branch.

It is another object of the present invention to substantially avoid disadvantageous problems associated with the snappy switching behavior of diode.

These and other objects and advantages of the present invention will become evident from the description which follows.

2. Brief Description of the Invention

According to the present invention, there is provided for a freewheeling diode device for a commutation branch. A first freewheeling diode with a soft recovery behavior includes a first anode and a first cathode. The first anode is connected to a common anode terminal A second freewheeling diode with a snappy recovery behavior includes a second anode and a second cathode. The second anode is connected to the common anode terminal. A common cathode terminal is connected to the first cathode and to the second cathode such that the second freewheeling diode is connected in parallel to the first freewheeling diode.

The first freewheeling diode can be optimized for a soft switching behavior and supports only a relatively small part of a forward current upon application of a forward voltage to the freewheeling diode device. The second freewheeling diode can be optimized on a low forward voltage drop and a fast switching. The second freewheeling diode can support a large part of the forward current in comparison to the part of the forward current carried by the first freewheeling diode.

The first freewheeling diode can exhibit a broad n− zone, furnished for a corresponding soft switching behavior. The second freewheeling diode can be a pin diode with a narrow i zone.

The first freewheeling diode can include a p+ zone with a decreased emitter efficiency. The second freewheeling diode can exhibit a p+ zone of a high emitter efficiency.

The first freewheeling diode can be a proton-irradiated freewheeling diode. The second freewheeling diode can be a gold-diffused epitaxial diode The ratio of a part of the forward current, passing through the first freewheeling diode relative to a part of the forward current of the second freewheeling diode, can be in the range of 1:2 or smaller.

A lifetime of charge carriers in the second freewheeling diode can be set such that a resulting reverse current level in the second freewheeling diode is less than a reverse current in the first freewheeling diode also in case of a steep commutation.

Application of a forward voltage can generate a forward current. A switching of a direction of the voltage can result in a current decrease of the current passing through the first freewheeling diode such that the current in the first freewheeling diode decreases to zero and then changes sign. The second freewheeling diode can still be passed by an electrical current in forward direction while the current in the first freewheeling diode assumes a zero value.

The reverse current through the first freewheeling diode can reach a first reverse maximum. The second freewheeling diode can still be passed by an electrical current in forward direction while the current in the first freewheeling diode assumes the first absolute value maximum. The forward current in the second freewheeling diode can begin a steep drop upon the reverse current passing through the first freewheeling diode reaching the first absolute value maximum. The current in the second freewheeling diode can fall through zero while the reverse current in the first freewheeling diode decreases in an absolute value of the reverse current in a direction of zero current. The reverse current through the second freewheeling diode can reach an absolute value maximum of the second freewheeling diode and can then drop toward zero.

The reverse current through the first freewheeling diode can decrease to a relative absolute value minimum while the reverse current of the second freewheeling diode reaches said absolute value maximum and then the absolute value of the reverse current through the first freewheeling diode can increase again to a second absolute value maximum. The reverse current of the second freewheeling diode can drop to substantially zero under oscillations. The reverse current of the first freewheeling diode can drop to substantially zero according to a substantially damping function.

The first absolute value maximum of the reverse current can be smaller than the second absolute value maximum of the reverse current.

The steep drop of the current in the second freewheeling diode can be at least three times as steep as the current drop in the second freewheeling diode prior to the reverse current in the first freewheeling diode reaching the first absolute value maximum.

A method for minimizing switching losses in freewheeling diodes includes the following steps.

According to the present invention it is provided that the freewheeling diode device includes a first diode with a soft recovery behavior and a second diode, connected in parallel to the first diode and exhibiting a snappy switching behavior. In accordance with the invention, there results a combination of the advantage of a low forward voltage drop with the advantage of a soft recovery behavior based on the parallel switching connection of the two diodes while simultaneously reducing the switching losses. For this purpose, two completely different types of fast diodes are connected in parallel. As described, the first diode, i.e. the diode exhibiting a soft recovery behavior, is optimized as to the switching behavior and the first diode carries only a small part of the forward current, for example 0.1 to 0.2 parts of the total current. In contrast, the second diode is optimized to exhibit a low forward voltage and a fast switching. The second diode carries the largest part of the forward current. Not only the switching losses are divided, but there result also overall substantially lower switching losses as compared to the known commutating branches based on the parallel connection of the two completely different types of fast diodes according to the present invention.

The first diode of the invention freewheeling diode device can be a diode which is furnished with a broad n⁻ zone and wherein the soft switching behavior is achieved by a low doping of the p+ emitter. The first diode can also be a diode, wherein a soft recovery behavior has been induced by proton irradiation. The second diode can exhibit a narrow n⁻ zone, wherein the doping of the p+ zone is selected with respect to a minimum forward voltage, wherein however the second diode exhibits simultaneously a snappy switching behavior.

The ratio of the part of the forward current of the first diode relative to the part of the forward current of the second diode can amount to about 1:2 as an order of magnitude or can be smaller than 1:2.

The novel features which are considered as characteristic for the invention are set forth in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

In the accompanying drawings, in which are shown several of the various possible embodiments of the present invention.

DESCRIPTION OF INVENTION AND PREFERRED EMBODIMENT

According to the present invention there is provided for a freewheeling diode device for a commutation branch including a switchable device element. The freewheeling diode device 10 includes a first diode 12 with a soft recovery behavior and a second diode 14 with a snappy recovery behavior. The second diode 14 is connected in parallel to the first diode 12.

The first diode 12 can be optimized for a soft switching behavior and supports only a relatively small part of the forward current. The second diode 14 can be optimized for exhibiting a low forward voltage drop and a fast switching. The second diode 14 can support a large part of the forward current in comparison to the part carried by the first diode 12.

The first diode 12 can exhibit a broad n⁻ zone, furnished for a corresponding soft switching behavior The second diode 14 can be a pin diode with a narrow i zone.

The first diode 12 can include a p+ zone with a decreased emitter efficiency degree. The second diode 14 can exhibit a p+ zone of a high emitter efficiency degree.

The first diode 12 can be a proton-irradiated freewheeling diode. The second diode 14 can be a gold-diffused epitaxial diode.

The ratio of a part of the forward current of the first diode 12 relative to a part of the forward current of the second diode 14 can be smaller than 1:2 and can amount up to a maximum of about 1:2.

A lifetime of charge carriers in the second diode 14 can be set such that a resulting reverse current level is less than a reverse current in the first diode 12 also in case of a steep commutation.

Figure 1:
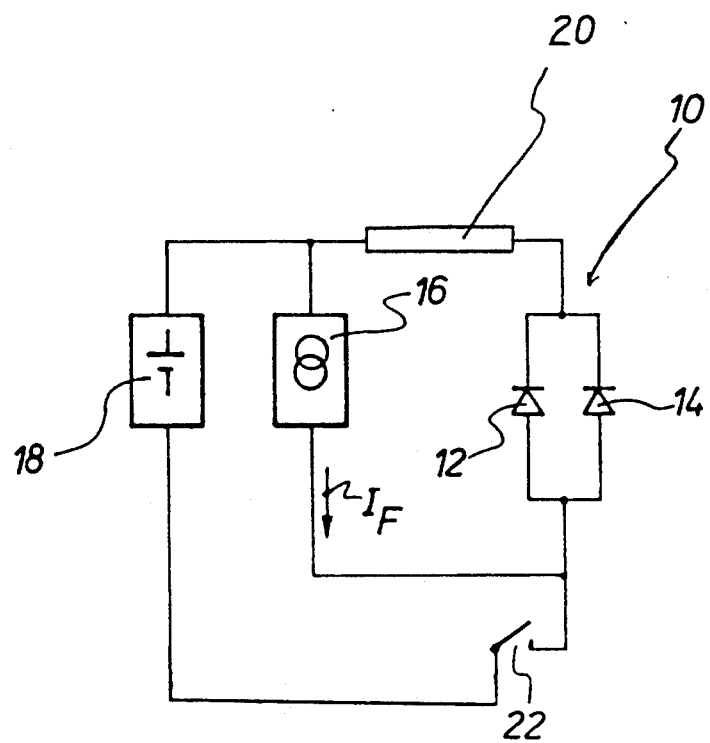
FIG. 1 is a schematic view of a circuit diagram of the measurement circuit for testing the freewheeling diode device.
Figure 2:
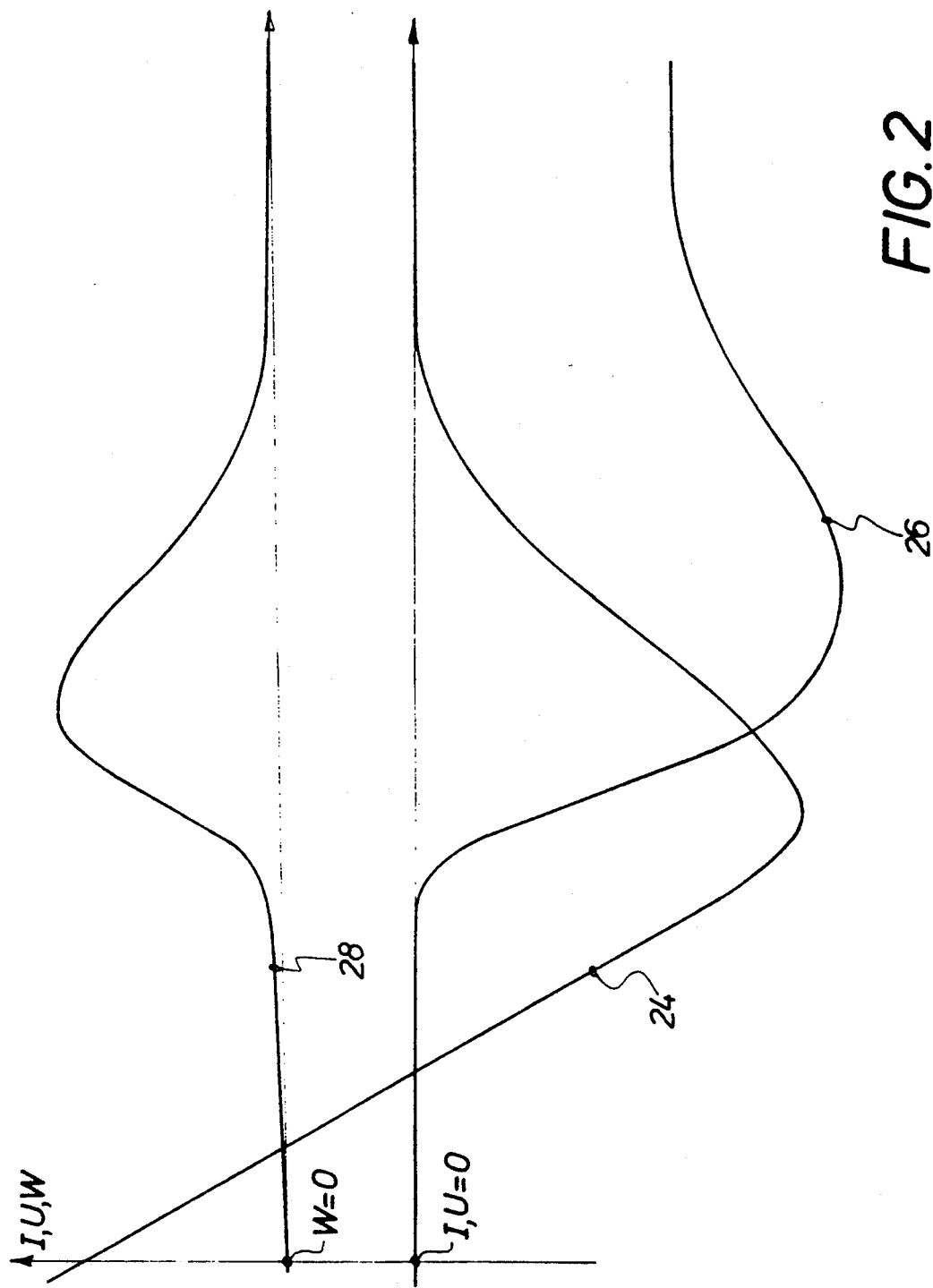
FIG. 2 is a view of a diagram illustrating the switching behavior of the first diode of the freewheeling diode device.

FIG. 1 illustrates the freewheeling diode device 10 with a first diode 12 and with a second diode 14, wherein the first diode 12 and the second diode 14 are connected parallel relative to each other. A constant current source 16 as well as a constant voltage source 18 are connected to the freewheeling diode device 10. An inductive or, respectively, mixed ohmic inductive load 20 is connected between the constant current source 16 and the freewheeling diode device 10. A switch 22 is connected between the constant voltage source 18 and the freewheeling diode device 10. The first diode 12 is a diode exhibiting a soft recovery behavior, such as is illustrated in FIG. 2, wherein the line 24 in FIG. 2 represents the course of the current I passing through the diode 12 relative to time, the line 26 represents the course of the voltage U relative to time, and the line 28 represents the switching losses W depending on time.

The second diode 14 of the freewheeling diode device 10, disposed in parallel to the diode 12, is the diode which is optimized to a low forward voltage and to a fast switching. The terms of "soft" and "snappy" are explained in more detail by way of FIG. 1. The reference numeral 18 designates the battery voltage, 16 the forward current source, and 20 represents an inductivity. The diode 12 and the diode 14 together represent the test samples. Upon closure of the switch 22, and if only diode 12 is connected the curve 24 illustrated in FIG. 2 is traced on the oscilloscope in case of a suitable adjustment.

Figure 7:
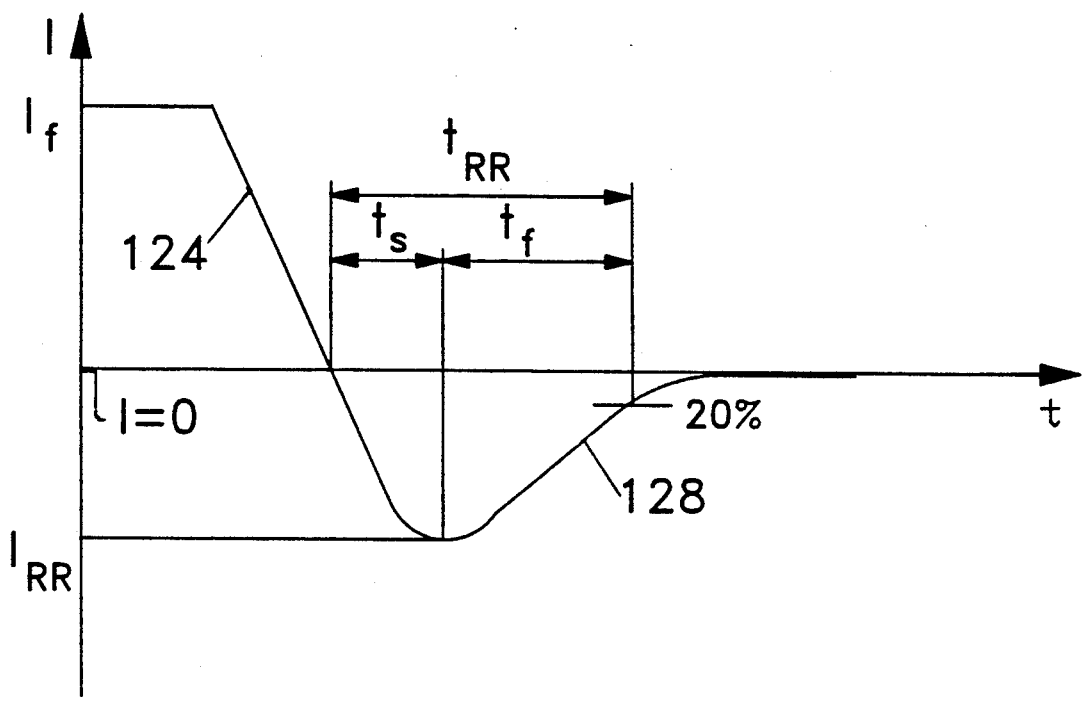
FIG. 7 is a view of a first schematic diagram showing parameters associated with a definition of snappy diode and soft diode.

FIG. 7 schematically illustrates the particular characteristics of this curve 24. The value of the differential value dI/dt in the area of reference numeral 124 represents the drop in current at the time of commutation. It can be recognized from FIG. 7 that after the current in forward direction reaches the level zero, then a reverse current occurs, which reverse current reaches a reverse maximum value of $I_{RR}$ and then decreases and drops to a small reverse value The differential of the current versus time, when the reverse current drops from its maximum value, is designated as $dI_R/dt$. Further characteristic values are the time $t_{RR}$ which is defined from the point in time where the current initially passing through the diode, reverses direction and the curve passes through the zero level up to the point in time where the reverse current drops from its maximum value $I_{RR}$ to a 20% value. This time period $t_{RR}$ can be subdivided in two time periods $t_s$ and $t_f$, wherein $t_s$ is the time period between the point in time when the curve representing the current passes through zero and becomes negative and when the maximum reverse current $I_{RR}$ is reached. The time $t_f$ is defined as the time from where the maximum reverse current is reached to the drop of such reverse current to a 20% value of the maximum $I_{RR}$. The quotient $t_f$ divided $t_s$ is designated with $w = t_f/t_s$ and gives a characteristic value for the diode behavior. In general, a diode having a value w larger than 0.7 is designated as a soft diode, and a diode having a value w smaller than 0.5 is called a snappy diode. Thus, it can be seen that the longer it takes for the reverse current to drop to the 20% value of its maximum, the softer the diode is considered. Values of w between 0.5 and 0.7 are intermediate between soft and snappy.

Furthermore, the time period $t_s$ is related to the slope of the curve on 124 and the time period $t_f$ is related to the slope of the curve 128.

Thus, another characteristic value for the distinction between soft diode and snappy diode can be based on the quotient of the differentials $$\frac{dI/dt}{dI_R/dt}$$

and this quotient is designated as s. Based on the parameter s, diodes which have a value of s larger than 0.8 are soft and diodes which have a value of s smaller than 0.5 are snappy. It is to be noted that, based on the geometric relationships shown in FIG. 7, there is of course a close parallel situation between the values of w and s. The value of $dI/dt$ is given as $-dI/dt$ is the backwards voltage divided trough the inductance L: $-dI/dt = V_b/L$.

Figure 8:
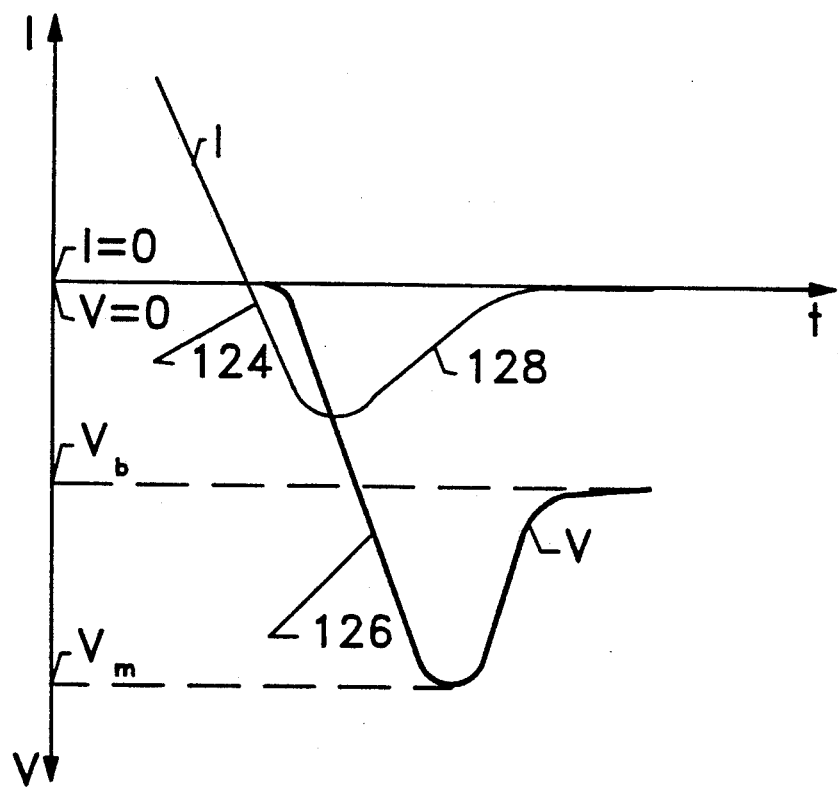
FIG. 8 is a view of a second schematic diagram showing parameters associated with a definition of snappy diode and soft diode.

The softness can further be defined based on the over voltage $V(m)$ which occurs during the switching and commutation as illustrated in FIG. 8 and is given as a backward voltage $V_b +$ the inductance times the differential $dI_R/dt$. Thus, the proportionality between $V_m$ and $dI_R/dt$ is immediately visible from this formula. Considering further that the value of $-dI/dt$ is equal to $V_b/L$ set forth above, thus, it is recognized by substituting the value of L divided by $V_b$ times $L/V_b$ that the $V_m$ can be written $V_m = V_b + L \times dI_R/dt$ and thus, the larger the value $V_m$ becomes, the snappier the diode behaves. The values $V_m$ are given for some examples in the tables associated with the present application.

Since the recovery behavior is also dependent on the size of the current $I_f$, the parameters w, s and $V_m$ for the snappiness are depending to some extent on the size of the forward current.

For the purposes of the present application a soft-recovery diode is present when s has a value larger than 0.8, where s can theoretically assume values up to about 4. It is stated that a soft-recovery diode can alternatively be defined by having a value w which is larger than 0.7. The snappy diode has an s value which is smaller than 0.5 and s can assume values as small as up to about 0.01.

Figure 9:
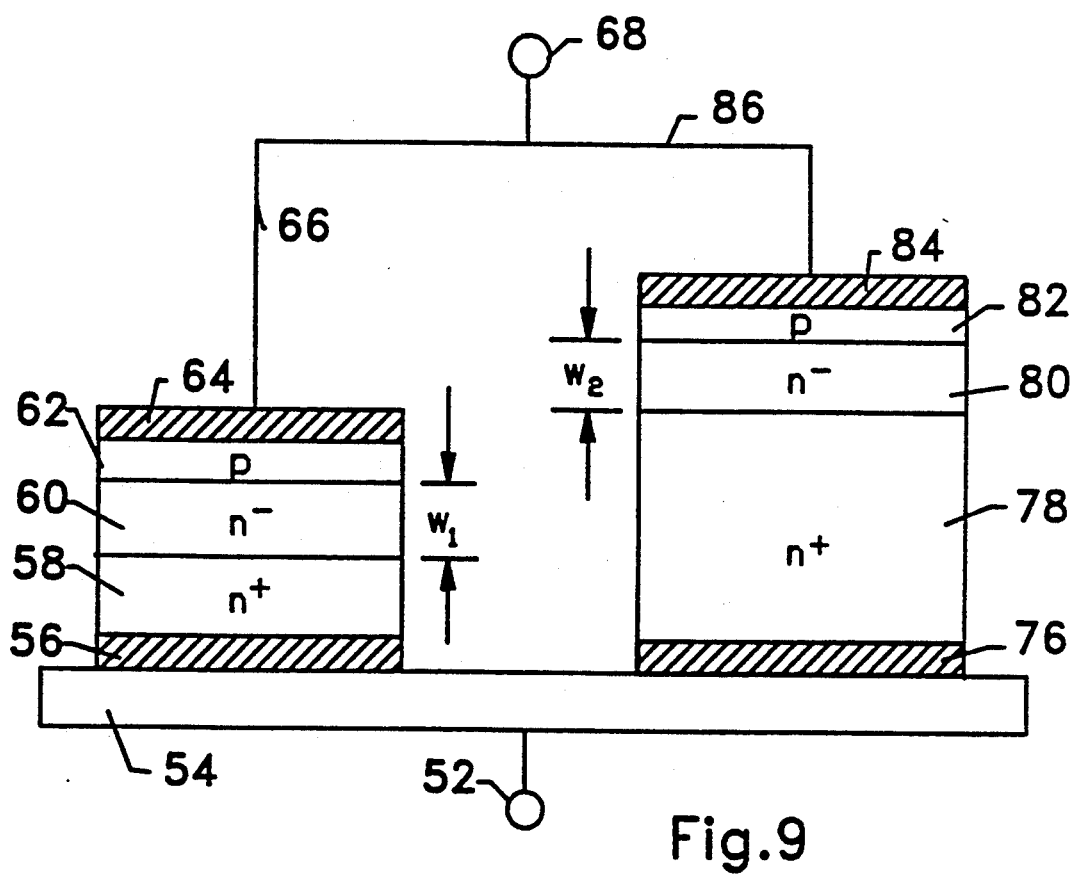
FIG. 9 is a sectional view of a first diode pair according to the invention.
Figure 10:
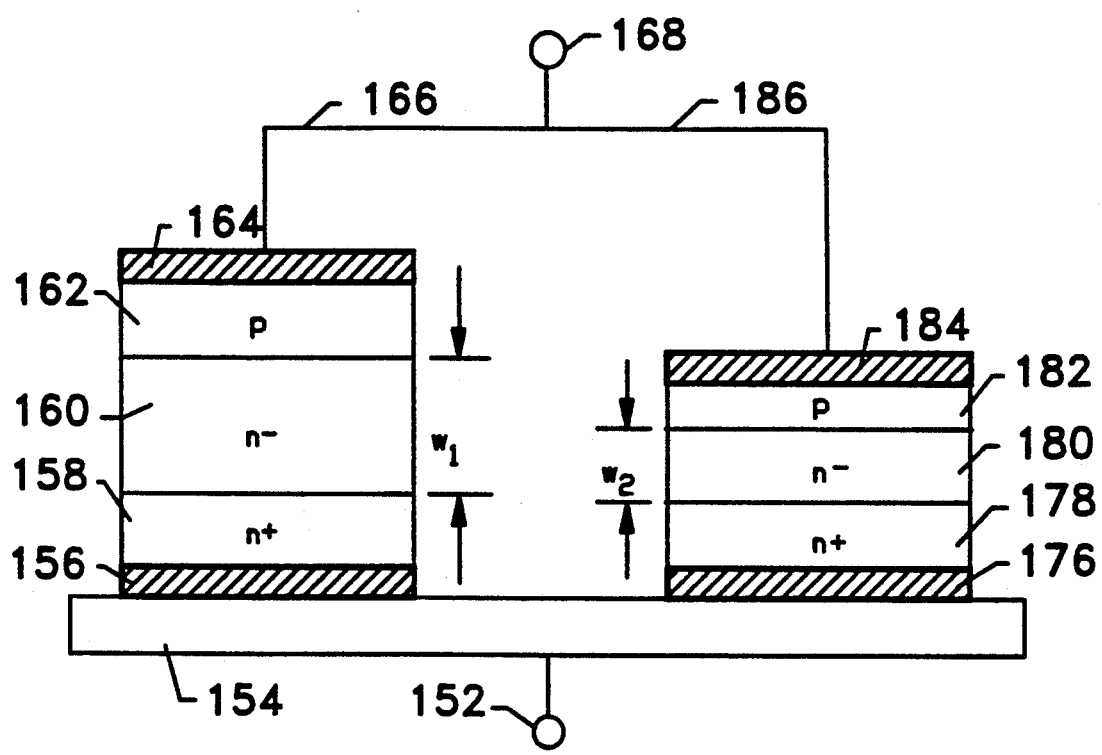
FIG. 10 is a sectional view of a second diode pair according to the invention.

The structure of the soft-recovery diode 12 and of the snappy-recovery diode 14 are illustrated by way of example in FIGS. 9 and 10. The cathode is designated with 52, 152 and is connected to adjoin a copper base plate 54, 154. The soft-recovery diode 12 includes a metallization zone 56, 156, an n+ zone 58, 158 adjoining the metallization zone 56, 156, and an n− zone 60, 160 adjoining the n+ zone 58, 158, a p conducting zone 62, 162 adjoining the n− zone 60, 160, a metallization zone 64, 164 adjoining the p zone 62, 162, an anode 68, 168 connected to the metallization zone 64, 164 by a conductor 66, 166. The snappy-recovery diode 14 is similarly constructed by having a metallization zone 76, 176 adjacent to the joint copper plate 54, 154, an n+ zone 78, 178 adjoining the metallization zone 76, 176, an n− zone 80, 180 adjoining the n+ zone 78, 178, a p zone 82, 182 adjoining the n− zone 80, 180, a metallization zone 84, 184 adjoining the p zone 82, 182, and a conductor 86, 186 connecting the metallization zone 84, 184 to the anode 68, 168.

FIGS. 9 and 10 show different dimensions for the thickness of the diodes. This depends on the kind of diode which is provided and, for example, the snappy diode 14 can be provided as an epitaxial diode and can thus be thicker than the diode soft recovery 12 as illustrated in FIG. 9.

In general, the thickness of the n− zone of the soft-recovery diode is larger than the corresponding zone of the snappy diode, since the smallest possible thickness is selected for the snappy diode The thickness of the snappy diode is limited only by the requirement of providing a certain blocking voltage.

The drawings FIGS. 9 include the diodes as are described in the Table 1. The width $w_1$ of the diode 12 is according to FIG. 9 is equal to 85 micrometers, and the width $w_2$ of the snappy diode is equal to 35 micrometers according to the example shown in FIG. 9.

The diodes are in this case provided of silicon crystals of different thicknesses. The thickness $w_1$ can amount to about 140 to 160 micrometers and the thickness $w_2$ can amount to about 90 to 110 micrometers. Each of these diodes is capable of providing a blocking voltage of up to 1600 volts. However, this is not a limiting value, since combinations for even higher voltage loads are possible The snappy diode 14 can be a so-called pin diode Such pin diode can be understood based on the reference Sze, Physics of Semiconductor Devices, New York, 1981 pages 104 and 105. Such a diode is characterized in that the center zone has a region of $10^{13}$ to $10^{14}$ in the impurity concentration, n− zone is doped as low as possible. The space charge zone shows in this case a trapezoidal course.

Such diodes are snappy. The n− zone of the diode 12 of the present application as set forth in claim 3, is dimensioned such that the course of the field is triangular, i.e. that according to the FIG. 32 on page 105 of Sze, this zone reaches up to the width $w_m$. Since this width again depends on the gradient of the field strength, the doping has to be selected as high as possible, i.e. as high as it is allowed by the required blocking voltage.

The forward voltage drop for a 400-volt diode, for example, with a current density of 160 A/cm$^2$ can be from about 1 to 1.4 volts and for a 1600 volt diode with a current density of 160 A/cm$^2$ can be from about 1.5 to 2 volts. A fast switching in the context of the present application denotes switching times of from about 60 nanoseconds to 150 nanoseconds or faster. The second diode 14 can support a large part of the current, i.e. from about 60 to 95 percent of the total current passing through diodes 12 and 14.

Figure 3:
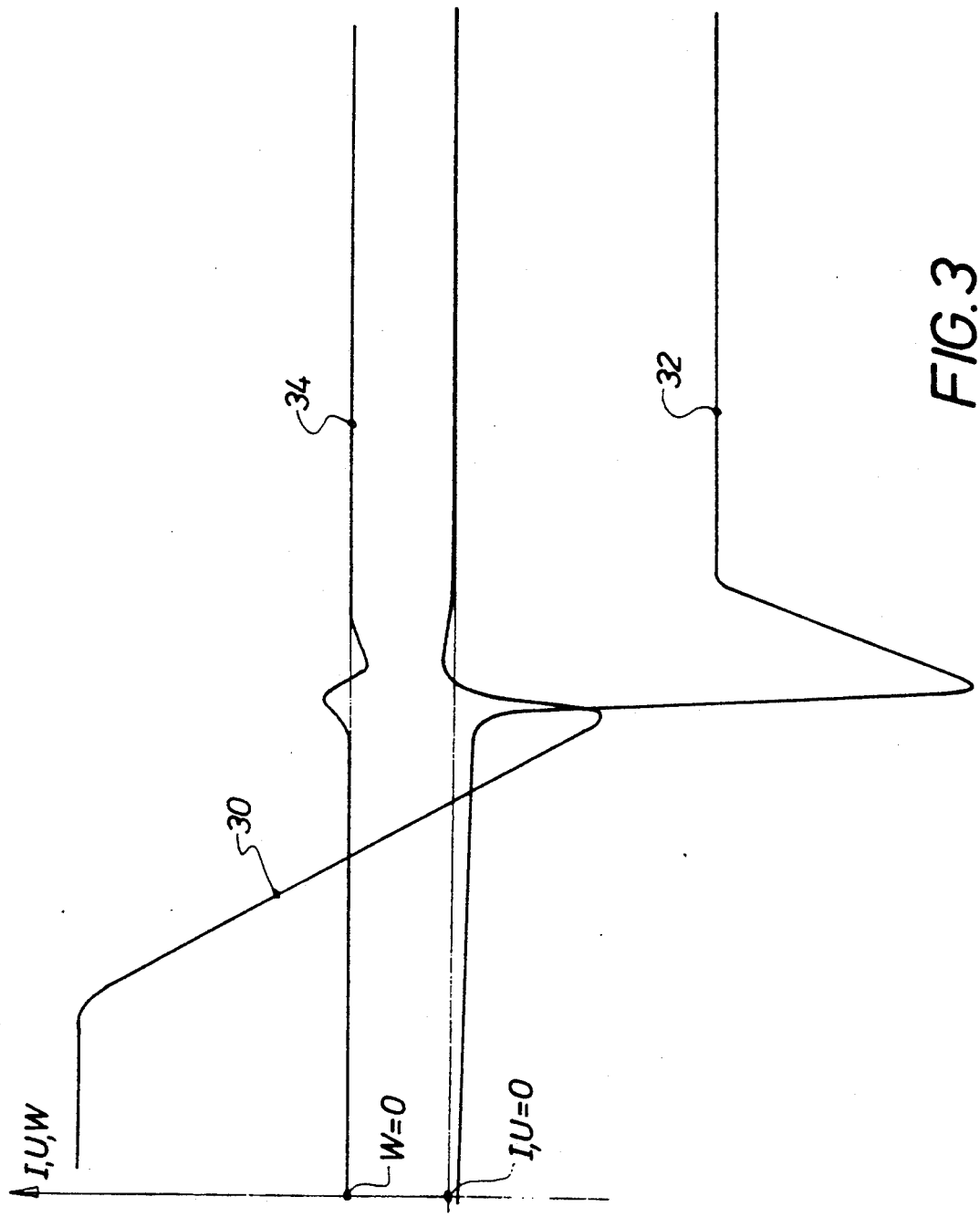
FIG. 3 is a view of a diagram illustrating the switching behavior of the second diode of the freewheeling diode device.

The switching behavior of the second snappy diode 14 is illustrated in FIG. 3, wherein the line 30 indicates the change of the current I relative to time, the line 32 illustrates the change of the voltage V relative to time, and the line 34 illustrates the power dissipation W depending on time. The time abscissas and the current ordinates exhibit the same scales in FIGS. 2 and 3, and the snappy switching behavior of the second diode 14 becomes readily clear in FIG. 3 based on a comparison between the curves shown in FIGS. 2 and 3.

For the production of soft diodes, it is possible that different methods and processes are used On one hand, it is possible to decrease efficiency of the p emitter, as described, for example, in the German Printed Patent Document DE-3,633,161, or to form a low doped emitter as described for example in the German Printed Patent Document DE 3,008,034, in the German Printed Patent Document DE 2,506,102, in the German Printed Patent Document DE 3,631,136, or in the German Printed Patent Document DE 3,823,795.

The soft diode can be further produced by irradiation with protons as shown for example in the journal article in Society Physics of Semiconductor 18, Issue 9 of September 1984, i.e. an energy of 2.25 MeV is employed with an irradiation strength of $5 \times 10^{12}$ particles per square centimeter, wherein the suitable range for the energy applied is 1.5 and 3 MeV and the particle density is from about $10^{12}$ to $2 \times 10^{13}$ per square centimeter.

The charge carrier lifetime is the time of existence of free charge carriers in the semiconductor body from the time of their generation up to their recombination and is consequently measured with a time dimension in seconds. For diodes, as those employed according to the present invention, the charge carrier lifetime can be at values of smaller than 100 nanoseconds. The level of the reverse current can be influenced by the charge carrier lifetime in the diode. If it is desired to have smaller reverse current values, then this goal can be supported by a decrease of the charge carrier lifetime, as is performed in practical situations, for example, by a higher temperature of a gold diffusion process.

A snappy diode can be produced by an epitaxial diode with gold diffusion as is taught in the U.S. Pat. No. 4,594,602 to Jimura, for example.

Figure 4:
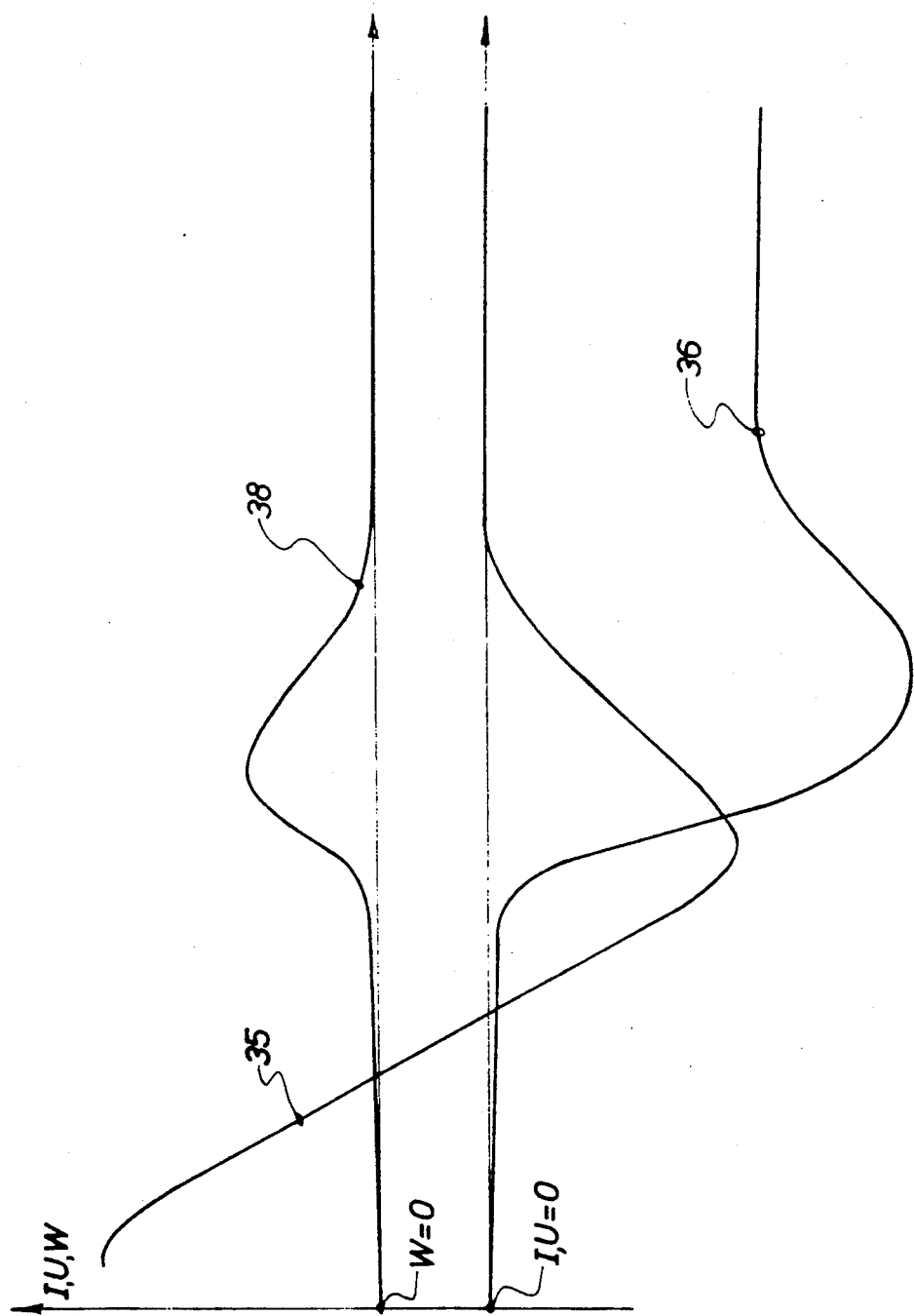
FIG. 4 is a view of a diagram illustrating the switching behavior of the parallel connection of the first diode and of the second diode.

The line 35 shows in FIG. 4 the change of the current I of the freewheeling diode device 10 relative to time, the line 36 shows the change of the voltage U relative to time of the freewheeling diode device 10, and the line 38 shows the change of the power dissipation W of the freewheeling diode device 10 relative to time, wherein the freewheeling diode device comprises two parallel connected diodes 12 and 14. It can be recognized from FIG. 4 that the freewheeling diode device 10 exhibits again a soft recovery behavior. However, a substantially smaller block delay charge or reverse recovery charge and thus a lower power dissipation is present in comparison to the recovery behavior of the first diode 12, as can be recognized from FIG. 2.

Figure 5:
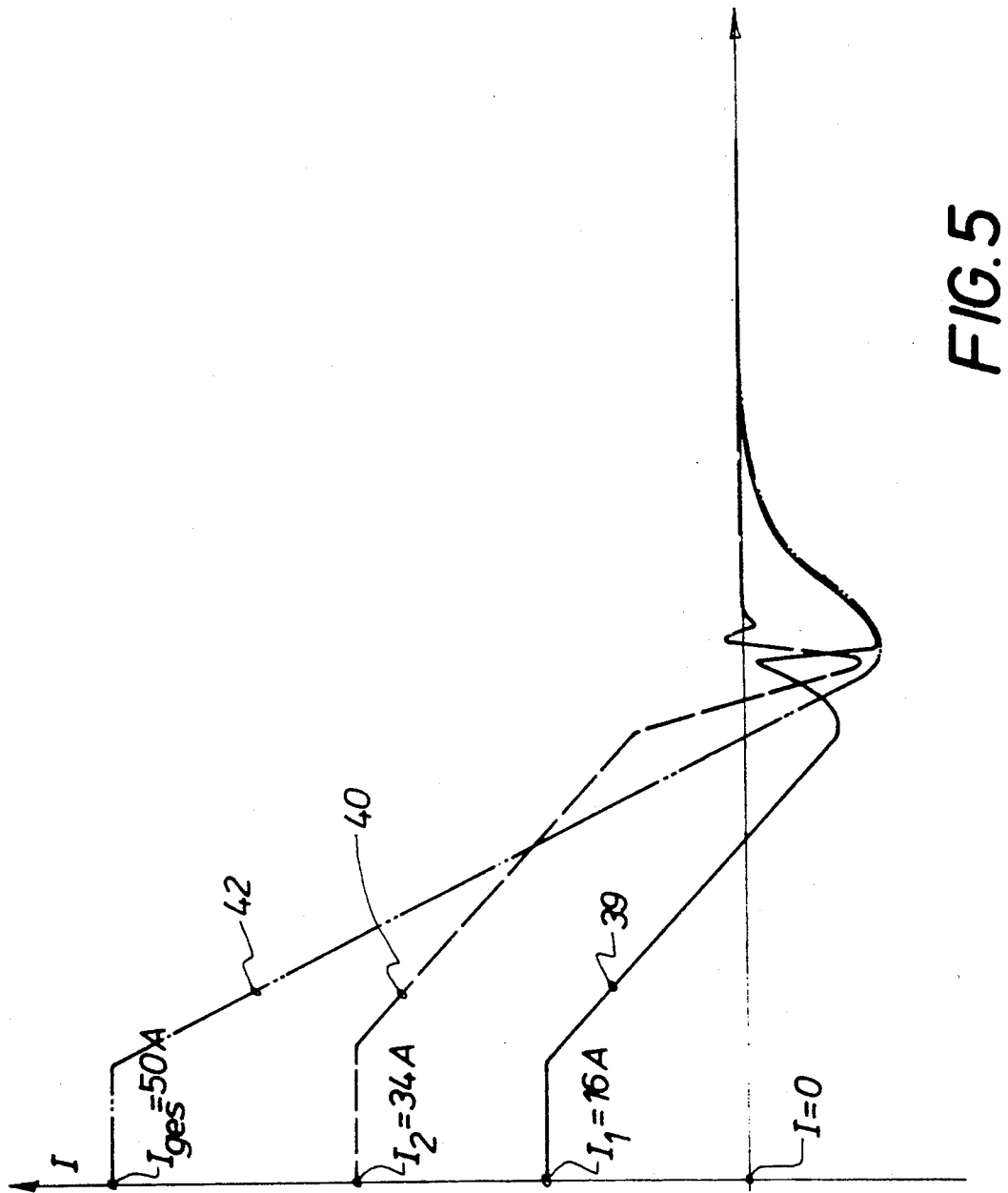
FIG. 5 is a view of a diagram illustrating the current subdivision of the two parallel connected diodes of the freewheeling diode device in a larger current scale.

The subdivision of the electrical currents onto the two parallel connected diodes 12 and 14 of the freewheeling diode device 10, as shown in FIG. 1, is illustrated in FIG. 5, wherein the line 39 illustrates the time-dependent course of the electrical current I flowing through the first diode 12, the line 40 illustrates the time-dependent course of the electrical current I flowing through the second diode 14, and the line 42 illustrates the sum of the two last recited electrical currents, i.e. the total current I of the freewheeling diode device 10 depending on time. The course of the current corresponds to the course of the current according to line 35 of FIG. 4, however, at a different scale. According to the example illustrated, the first diode 12 carries a current of 16 amps and the second diode 14 carries a current of 34 amps, such that the overall current $I_{ges}$ of the freewheeling diode device 10 amounts to 50 amps.

Figure 6:
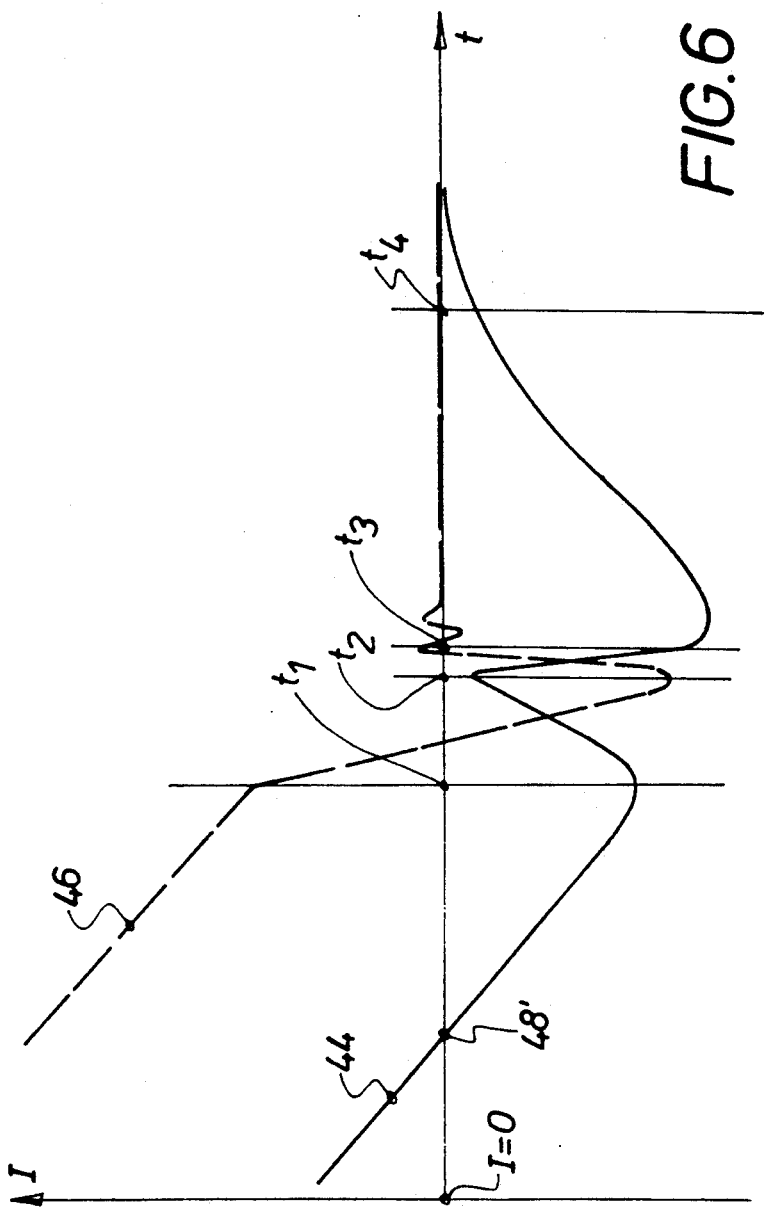
FIG. 6 is a view of a diagram illustrating the course of the current relative to time in each of the two parallel connected freewheeling diodes at the point in time of the commutation.

FIG. 6 illustrates and explains in more detail based on a larger time scale the switching steps and processes in the two diodes 12 and 14 of the freewheeling diode device 10 at the point in time of the commutation, wherein the electrical current I at the recited point in time is illustrated in this figure in each of the two diodes.

Under forward operation, the first diode 12 will pass from about 0.05 to 0.4 parts of the total current and preferably from about 0.1 to 0.2 parts of the total current passing through diodes 12 and 14.

The line 44 shows the change relative to time of the electrical current, flowing through the first diode 12, and the line 46 illustrates the change relative to time of the electrical current, flowing through the second diode 14 of the freewheeling diode device 10.

Initially, the current is commutated in each of the two diodes 12 and 14 with a current change of about 50 amps/microsecond. The first diode 12 reaches according to the curve 44 in FIG. 6 initially the passage of the current curve through zero at 48 and, at the point in time $t_1$, a reverse current deflection point or reverse current maximum point. Beginning with this point in time $t_1$, the first diode 12 would be ready to receive an electrical voltage. At this point in time $t_1$, however, the second diode 14 is still passed by an electrical current in forward direction, as can be recognized by the line 46 illustrated in FIG. 6. This means that at this point in time $t_1$ still no electrical voltage can be built up. Starting from the point in time $t_1$, the current of the second diode 14 is now particularly steeply commutated, until the second diode 14 can also receive electrical voltage at the point in time $t_2$. Particularly steeply means in this context that the differential quotient of current versus time is more than 100 A/$\mu$s and typically 200 A/$\mu$s The electrical voltage, against which the commutation occurs, is not present at the time between the point in time $t_1$ and the point in time $t_2$ at the two diodes 12 and 14. The pn transition is emptied of electrical majority charge carriers in the second diode 14 between the point in time $t_1$ and the point in time $t_2$. The reverse current decreases in the first diode 12 by the amount which is accepted and taken over by the second diode 14. The total current composed of the partial currents, flowing through the first diode 12 and through the second diode 14, is imposed and applied during this time span by the outer circuit. The pn transition becomes free of electrical charge carriers in the second diode 14 at the point in time $t_2$. Then, the second diode 14 exhibits a sharp reverse current drop. This reverse current degree effects however only a displacement of the electrical current into the first diode 12, where the first diode 12 contains as previously sufficient charge carriers. The second diode 14 is already cleared of charge carriers at the point in time $t_3$. No voltage peak, generated by the sharp current degree occurs since the total current has no sharp degree. The increasing voltage effects in the first diode 12 an emptying of the residual charge carriers. This course is determined up to the point in time $t_4$ by a soft recovery behavior.

The following Table 1 provides by way of example an overview of the essential parameters of the first diode 12 and of the second diode 14 as well as of the parallel connection of the two diodes according to the freewheeling diode device of the present invention. It can be recognized from the table that the reverse recovery charge $Q_{RR}$ is reduced by more than 50%. This has an advantageous effect directly on the switching losses. The switching losses amount only to about 40% of the switching losses of the first diode 12.

Thus, it is possible according to the invention that the forward passage losses and the switching losses are decoupled and these two parameters are optimized separately from each other. Furthermore, as already recited, the switching losses are substantially reduced when employing the present invention structure.

TABLE 1

A parallel connection of a proton-irradiated diode 12, soft at 125° C., and of a gold-diffused epitaxial diode 14, snappy at 125° C.

|  | Diode 12 by itself | Diode 14 by itself | Freewheeling Diode Device 10 (diodes 12 and 14 connected in parallel |
| --- | --- | --- | --- |
| $I_{RR}$ (50 A, −100 A/μs, 250 V, 125° C.) | 18.4 A | 4.9 A | 11.8 A |
| $Q_{RR}$ (50 A, −100 A/μs, 250 V, 125° C.) | 5.7 μC | 0.3 μC | 2.4 μC |
| $V_m$ (50 A, −100 A/μs, 250 V, 125° C.) | 404 V | 490 V | 396 V |
| $W_{off}$ $I_F$ in case of parallel connection | 1080 μJ | 80 μJ | 394 μJ 50 A Subdivision: 1st diode: 16A 2nd diode: 34A |

The following abbreviations are employed in the Table:
$I_{RR}$ = reverse current peak
$Q_{RR}$ = reverse recovery charge
$V_m$ = peak voltage occurring during the commutation (measure for the softness)
$W_{off}$ = switching losses
$I_F$ = total current It will be understood that each of the elements described above, or two or more together, may also find a useful application in other types of electrical device elements differing from the types described above.

While the invention has been illustrated and described as embodied in the context of a freewheeling diode device including a first and a second diode, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims.

1. A freewheeling diode device for a commutation branch comprising
a common anode terminal;
a first freewheeling diode with a soft recovery behavior and having a first anode and having a first cathode wherein the first anode is connected to the common anode terminal;
a second freewheeling diode with a snappy recovery behavior and having a second anode and a second cathode, wherein the second anode is connected to the common anode terminal;
a common cathode terminal connected to the first cathode and connected to the second cathode such that the second freewheeling diode is connected in parallel to the first freewheeling diode.

2. The freewheeling diode device according to claim 1, wherein the first freewheeling diode is optimized for a soft recovery behavior and supports only a relatively small part of a forward current upon application of a forward voltage to the freewheeling diode device, and wherein the second freewheeling diode is optimized to a low forward voltage drop and a fast switching, and wherein the second freewheeling diode supports a large part of the forward current in comparison to the part of the forward current carried by the first diode.

3. The device according to claim 1, wherein the first freewheeling diode exhibits a broad n− zone, furnished for a corresponding soft recovery behavior, and wherein the second freewheeling diode is a pin diode with a narrow i zone.

4. The device according to claim 1, wherein the first freewheeling diode includes a p+ zone with a decreased emitter effectiveness degree, wherein the second freewheeling diode exhibits a p+ zone of a high emitter effectiveness degree.

5. The device according to claim 1, wherein the first freewheeling diode is a proton-irradiated freewheeling diode, and wherein the second freewheeling diode is a gold-diffused epitaxial diode.

6. The device according to claim 1, wherein the ratio of a part of the forward current, passing through the first freewheeling diode relative to a part of the forward current of the second freewheeling diode, is smaller than 1:2.

7. The device according to claim 1, wherein
a lifetime of charge carriers in the second freewheeling diode is set such that a resulting reverse current level in the second freewheeling diode is less than a reverse current in the first freewheeling diode also in case of a steep commutation.

8. The device according to claim 1, wherein
application of a forward voltage generates a forward current, wherein a switching of a direction of the voltage results in a current decrease of the current passing through the first freewheeling diode such that the current in the first freewheeling diode decreases to zero and then changes sign, wherein the second freewheeling diode is still passed by an electrical current in forward direction while the current in the first freewheeling diode assumes a zero value.

9. The device according to claim 8, wherein
a reverse current through the first freewheeling diode reaches a first absolute value maximum, wherein the second freewheeling diode is still passed by an electrical current in forward direction while the current in the first freewheeling diode assumes the first absolute value maximum, wherein the forward current in the second freewheeling diode begins a steep drop upon the reverse current passing through the first freewheeling diode reaching the first absolute value maximum, wherein the current in the second freewheeling diode falls through zero while the reverse current in the first freewheeling diode decreases in an absolute value of the reverse current in a direction of zero current, wherein the reverse current through the second freewheeling diode reaches an absolute value maximum of the second freewheeling diode and then drops toward zero.

10. The device according to claim 9, wherein the reverse current through the first freewheeling diode decreases to a relative absolute value minimum while the reverse current of the second freewheeling diode reaches said absolute value maximum and then the absolute value of the reverse current through the first freewheeling diode increases again to a second absolute value maximum, wherein the reverse current of the second freewheeling diode drops to substantially zero under oscillations, and wherein the reverse current of the first freewheeling diode drops to substantially zero according to a substantially damping function.

11. The device according to claim 10, wherein the first absolute value maximum of the reverse current is smaller than the second absolute value maximum of the reverse current.

12. The device according to claim 9, wherein the steep drop of the current in the second freewheeling diode is at least three times as steep as the current drop in the second freewheeling diode prior to the reverse current in the first freewheeling diode reaching the first absolute value maximum.

13. A freewheeling diode device for a commutation branch including a switchable device element, wherein the freewheeling diode device (10) includes a first diode (12) with a soft recovery behavior and a second diode (14) with a snappy recovery behavior, wherein the second diode (14) is connected in parallel to the first diode (12).

14. The freewheeling diode device according to claim 13, wherein the first diode (12) is optimized for a soft recovery behavior and supports only a relatively small part of the forward current, and wherein the second diode (14) is optimized to a low forward voltage drop and a fast switching, and wherein the second diode (14) supports a large part of the forward current in comparison to the part carried by the first diode (12).

15. The device according to claim 13, wherein the first diode (12) exhibits a broad n− zone, furnished for a corresponding soft recovery behavior, and wherein the second diode (14) is a pin diode with a narrow i zone.

16. The device according to claim 13, wherein the first diode (12) includes a p+ zone with a decreased emitter effectiveness degree, wherein the second diode (14) exhibits a p+ zone of a high emitter effectiveness degree.

17. The device according to claim 13, wherein the first diode (12) is a proton-irradiated freewheeling diode, and wherein the second diode (14) is a gold-diffused epitaxial diode.

18. The device according to claim 13, wherein the ratio of a part of the forward current of the first diode (12) relative to a part of the forward current of the second diode (14) is smaller than 1:2 and amounts up to a maximum of about 1:2.

19. The device according to claim 13, wherein a lifetime of charge carriers in the second diode (14) is set such that a resulting reverse current level is less than a reverse current in the first diode (12) also in case of a steep commutation.

20. A method for minimizing switching losses in freewheeling diodes, comprising
furnishing a common anode terminal;
connecting a first anode of a first freewheeling diode with a soft recovery behavior to the common anode terminal;
connecting a second anode of a second freewheeling diode with a snappy recovery behavior to the common anode terminal;
connecting a common cathode terminal to a first cathode of the first freewheeling diode;
connecting the common cathode terminal to a second cathode of the second freewheeling diode such that the second freewheeling diode is connected in parallel to the first freewheeling diode.

21. The method for minimizing switching losses in freewheeling diodes according to claim 20, further comprising
applying a forward voltage to the common anode terminal and to the common cathode terminal;
switching the direction of the voltage applied to the common anode terminal and to the common cathode terminal thereby:
decreasing the current passing through the first freewheeling diode such that the current in the first freewheeling diode decreases to zero and then changes sign, wherein the second freewheeling diode is still passed by an electrical current in forward direction while the current in the first freewheeling diode assumes a zero value.

22. The method for minimizing switching losses in freewheeling diodes according to claim 21, further comprising
allowing a reverse current through the first freewheeling diode to reach a first absolute value maximum, wherein the second freewheeling diode is still passed by an electrical current in forward direction, while the current in the first freewheeling diode assumes the first absolute value maximum;
steeply dropping the forward current in the second freewheeling diode upon the reverse current passing through the first freewheeling diode reaching the first absolute value maximum;
allowing the current in the second freewheeling diode to fall through zero while the reverse current in the first freewheeling diode decreases its absolute value of the reverse current in a direction of zero current, wherein the reverse current through the second freewheeling diode reaches an absolute value maximum and then drops toward zero.

23. The method for minimizing switching losses in freewheeling diodes according to claim 21, further comprising
decreasing the reverse current through the first freewheeling diode to a relative absolute value minimum while the reverse current of the second freewheeling diode reaches said absolute value maximum;
increasing then again the absolute value of the reverse current through the first freewheeling diode to a second absolute value maximum;

dropping the reverse current of the second freewheeling diode to substantially zero under oscillations, and wherein the reverse current of the first freewheeling diode drops to substantially zero according to a substantially damping function.

24. The method for minimizing switching losses in freewheeling diodes according to claim 23, further comprising restricting the first absolute value maximum of the reverse current to a value smaller than the value of the second absolute value maximum of the reverse current;

inducing the steep drop of the current in the second freewheeling diode at least three times as steep as the current drop in the second freewheeling diode prior to the reverse current in the first freewheeling diode reaching the first absolute value maximum.

* * * * *